(12) United States Patent
Teh et al.

(10) Patent No.: US 9,505,610 B2
(45) Date of Patent: Nov. 29, 2016

(54) DEVICE, SYSTEM AND METHOD FOR PROVIDING MEMS STRUCTURES OF A SEMICONDUCTOR PACKAGE

(71) Applicants: Weng Hong Teh, Cambridge, MA (US); Tarek A Ibrahim, Mesa, AZ (US); Sarah K Haney, Cary, NC (US); Daniel N Sobieski, Phoenix, AZ (US); Parshuram B Zantye, Morganville, NJ (US); Chad E Mair, Chandler, AZ (US); Telesphor Kamgaing, Chandler, AZ (US)

(72) Inventors: Weng Hong Teh, Cambridge, MA (US); Tarek A Ibrahim, Mesa, AZ (US); Sarah K Haney, Cary, NC (US); Daniel N Sobieski, Phoenix, AZ (US); Parshuram B Zantye, Morganville, NJ (US); Chad E Mair, Chandler, AZ (US); Telesphor Kamgaing, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/129,541

(22) PCT Filed: Sep. 25, 2013

(86) PCT No.: PCT/US2013/061762
§ 371 (c)(1),
(2) Date: Dec. 26, 2013

(87) PCT Pub. No.: WO2015/047257
PCT Pub. Date: Apr. 2, 2015

(65) Prior Publication Data
US 2015/0084139 A1 Mar. 26, 2015

(51) Int. Cl.
*H01L 21/00* (2006.01)
*B81C 1/00* (2006.01)

(52) U.S. Cl.
CPC ....... *B81C 1/00246* (2013.01); *B81C 1/00261* (2013.01); *B81C 1/00277* (2013.01); *B81B 2201/0271* (2013.01); *H01L 2924/01079* (2013.01)

(58) Field of Classification Search
CPC .............. H01L 2924/01079; B81C 1/00261; B81C 1/00277; B81B 2201/0235; B81B 2201/0271
See application file for complete search history.

(56) References Cited

U.S. PATENT DOCUMENTS 6,248,668 B1 * 6/2001 Beebe et al. ................. 438/702
6,537,896 B1 3/2003 Catabay et al.
(Continued)

FOREIGN PATENT DOCUMENTS

| KR | 102010026021 | 3/2010 |
|---|---|---|
| WO | WO-2013089673 | 6/2013 |
| WO | WO-2013101156 | 7/2013 |

OTHER PUBLICATIONS

"International Search Report and Written Opinion for PCT Patent Application No. PCT/US2013/061762", (May 27, 2014), Whole Document.

(Continued)

*Primary Examiner* — Su C Kim
(74) *Attorney, Agent, or Firm* — Blakely, Sokoloff, Taylor & Zafman LLP

(57) ABSTRACT

Techniques and mechanisms for providing precisely fabricated structures of a semiconductor package. In an embodiment, a build-up carrier of the semiconductor package includes a layer of porous dielectric material. Seed copper and plated copper is disposed on the layer of porous dielectric material. Subsequent etching is performed to remove copper adjacent to the layer of porous dielectric material, forming a gap separating a suspended portion of a MEMS structure from the layer of porous dielectric material. In another embodiment, the semiconductor package includes a copper structure disposed between portions of an insulating layer or portions of a layer of silicon nitride material. The layer of silicon nitride material couples the insulating layer to another insulating layer. One or both of the insulating layers are each protected from desmear processing with a respective release layer structure.

19 Claims, 13 Drawing Sheets

(56) References Cited

U.S. PATENT DOCUMENTS

| | | |
|---|---|---|
| 8,633,551 B1 | 1/2014 | Teh et al. |
| 2005/0148209 A1 | 7/2005 | Chu et al. |
| 2006/0138663 A1 | 6/2006 | Clarke et al. |
| 2010/0026601 A1* | 2/2010 | Chang .................. H01L 23/585 343/834 |
| 2010/0178761 A1* | 7/2010 | Chen ................. H01L 21/76898 438/613 |
| 2012/0161278 A1 | 6/2012 | Meyer et al. |
| 2013/0168852 A1* | 7/2013 | Liang et al. ................. 257/737 |
| 2014/0000377 A1 | 1/2014 | Lin et al. |
| 2014/0001583 A1 | 1/2014 | Teh et al. |
| 2014/0076051 A1 | 3/2014 | Ma et al. |
| 2014/0083858 A1 | 3/2014 | Teh et al. |

OTHER PUBLICATIONS

International Preliminary Report on Patentability for PCT Patent Application No. PCT/US2013/061762, mailed Apr. 7, 2016, 11 pgs.
Taiwan Office Action for Application No. 103132429, dated Jul. 13, 2016, 11 pages.

* cited by examiner

DEVICE, SYSTEM AND METHOD FOR PROVIDING MEMS STRUCTURES OF A SEMICONDUCTOR PACKAGE

CLAIM OF PRIORITY

This application is a U.S. National Phase application under 35 U.S.C. §371 of International Application No. PCT/US2013/061762, filed Sep. 25, 2013, entitled "DEVICE, SYSTEM AND METHOD FOR PROVIDING MEMS STRUCTURES OF A SEMICONDUCTOR PACKAGE," the entire contents of which are incorporated herein by reference.

BACKGROUND

1. Technical Field

Embodiments of the invention are in the field of semiconductor packages and more particularly, but not exclusively, semiconductor packages with microelectromechanical system (MEMS) structures.

2. Background Art

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density.

Furthermore, for the past several years, microelectromechanical systems (MEMS) or other structures have been playing an increasingly important role in consumer products. For example, MEMS devices, such as sensors, actuators, and mirrors, can be found in products ranging from air-bag triggers in vehicles to displays in the visual arts industry. As these technologies mature, the demands on precision and functionality of such MEMS or other structures have escalated. Furthermore, consistency requirements for the performance of MEMS devices (both intra-device and device-to-device) often dictates that the processes used to fabricate such MEMS devices need to be extremely sophisticated.

Although packaging scaling is typically viewed as a reduction in size, the addition of functionality in a given space is also considered. However, structural issues may arise when attempting to package semiconductor die with additional functionality also housed in the package. For example, the addition of packaged MEMS devices may add functionality, but ever decreasing space availability in a semiconductor package may provide obstacles to adding such functionality.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide a semiconductor package including a narrow gap to separate a suspended portion of a MEMS structure from a proximate surface. For example, a layer of porous dielectric material may be formed for a build-up carrier of the semiconductor package. A seed layer may be disposed on the layer of porous dielectric material, and copper subsequently plated or otherwise disposed on the seed layer. A subsequent etching may be performed to remove copper adjacent to the layer of porous dielectric material, resulting in formation of the suspended portion of the MEMS structure Alternatively or in addition, certain embodiments provide for such a semiconductor package to include a copper structure disposed between portions of an insulating layer and/or portions of a layer of silicon nitride material, where the layer of silicon nitride material couples the insulating layer to another insulating layer. In an embodiment, one or both of the insulating layers are variously protected from desmear processing. Such protection from desmear processing may contribute to a smoothness of the copper structure. Alternatively or in addition, the copper structure may be a beam, cantilever or other suspended portion of a MEMS device.

A packaged MEMS device may be housed in any of a variety of packaging options according to different embodiments. One such option is housing in a substrate formed by a BBUL process. For example, FIGS. 1A-1I illustrate cross-sectional views of various operations in a process of fabricating a packaged MEMS device having a suspended beam structure, in accordance with an illustrative embodiment.

Figure 1A:
FIGS. 1A-1I illustrate cross-sectional views of various operations of a process to fabricate a packaged MEMS device according to an embodiment.
Figure 1B:
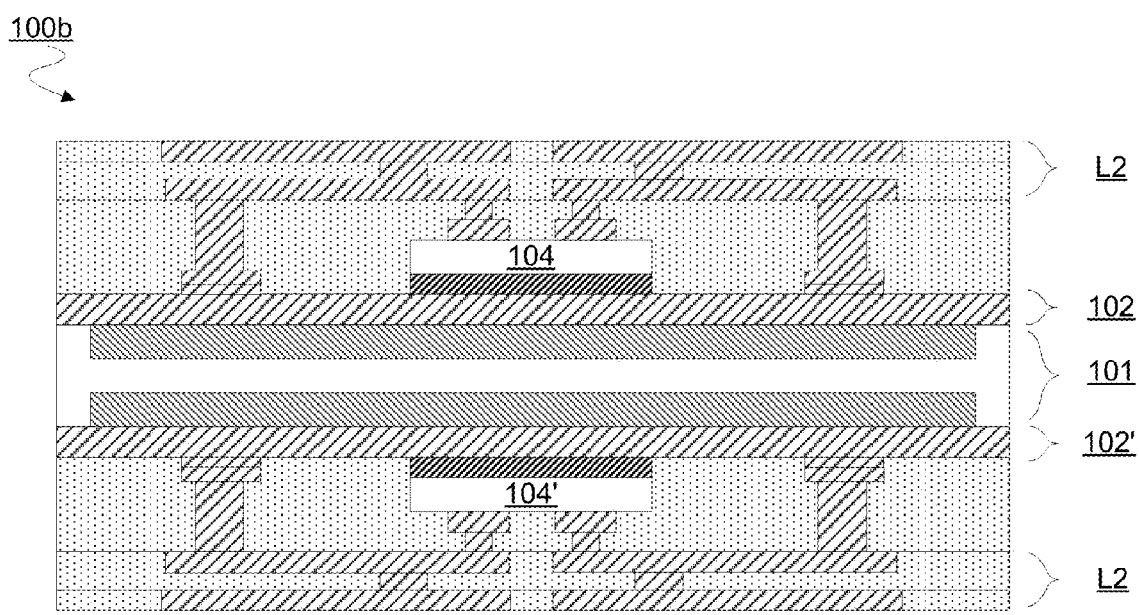

Referring to FIG. 1A, a simplified view 100*a* of a carrier 101 including two panel sides 102 and 102' is depicted. A fully embedded process may be performed to package die 104/104' on either panel 102/102', respectively. As an example, FIG. 1B depicts a view 100*b* of a BBUL fully embedded die process up to level 2 (L2) metal layer definition. BBUL is a processor packaging technology that is bumpless since it does not use the usual small solder bumps to attach the silicon die to the processor package wires. It has build-up layers since it is grown or built-up around the silicon die. Although certain embodiments are not limited in this regard, some semiconductor packages now use a coreless substrate, which does not include the thick resin core layer commonly found in conventional substrates. In an embodiment, as part of the BBUL process, electrically conductive vias and routing layers are formed above the active side of the semiconductor die 104/104' using a semi-additive process (SAP) to complete remaining layers.

Thus, referring again to FIG. 1B, a semiconductor die may be packaged on a panel of a carrier. Carrier 101 may be provided having planar panels or panels with a plurality of cavities disposed therein, each sized to receive a semiconductor die 104/104'. Although certain embodiments are not limited in this regard, identical structures (e.g., 102 and 102') may be mated during processing in order to build a back-to-back apparatus for processing utility. Consequently, processing throughput is effectively doubled. The structure shown in FIG. 1B may form part of a larger carrier/panel structure with a plurality of identical regions having a similar or the same cross-section.

For example, a carrier may include panels with 1000 recesses on either side, allowing for fabrication of 2000 individual packages from a single carrier. The panel may include an adhesion release layer and an adhesive binder. A cutting zone may be provided at each end of the apparatus 102 or 102' for separation processing. A backside of a semiconductor die may be bonded to the panel with a die-bonding film. Encapsulating layers may be formed by a lamination process. In another embodiment, one or more encapsulation layers may be formed by spinning on and curing a dielectric upon a wafer-scale array of apparatuses, of which the apparatus 102/102' is merely a subset for illustrative simplicity.

In an embodiment, a MEMS bottom electrode (not shown) may be formed in one of the build-up layers—e.g. by a sequence of electroless plating, dry film resist (DFR) patterning, electroplating, and flash etch processing. Such a MEMS bottom electrode may be provided for ultimate electrostatic actuation or capacitive sensing detection of a MEMS actuator/sensor structure to couple to such an electrode. Formation of one such BBUL MEMS structure 118 according to an illustrative embodiment is discussed hereafter with reference to FIGS. 1C-1I.

Figure 1C:
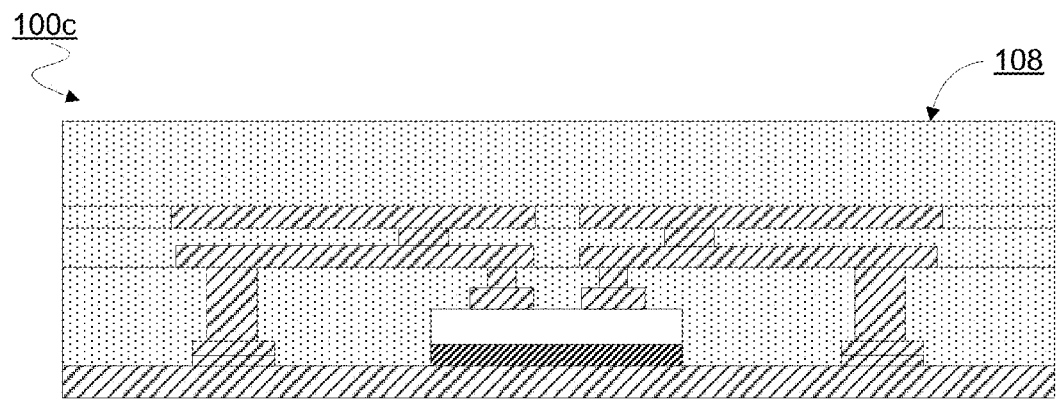

Referring to view 100c of FIG. 1C, a BBUL MEMS bottom sacrificial layer 108 may be defined—e.g. on a release etch stop layer lamination layer (e.g., low-E Ajinomoto Build-up Film or derivative thereof having a lower plasma etch rate than a standard ABF film) of the build-up layers. It is noted that only one side of the BBUL panel is shown for simplicity from FIG. 1C and on.

Figure 1D:
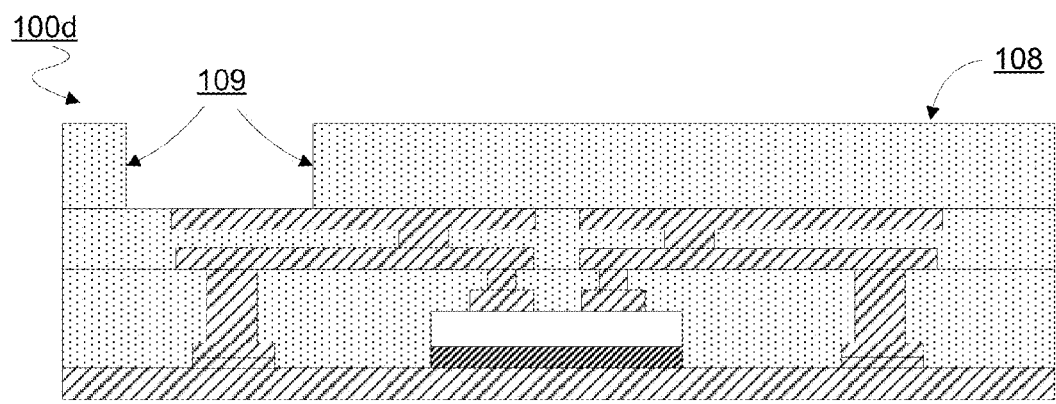

As shown in view 100d of FIG. 1D, walls 109 may be formed to define in BBUL MEMS bottom sacrificial layer 108 a hole to position and/or provide a mechanical anchoring point for the MEMS actuator structure 118. Formation of the hole in BBUL MEMS bottom sacrificial layer 108 may be performed with a $CO_2$ laser, an ultraviolet (UV) laser or the like—e.g. depending upon the thickness of BBUL MEMS bottom sacrificial layer 108.

Figure 1E:
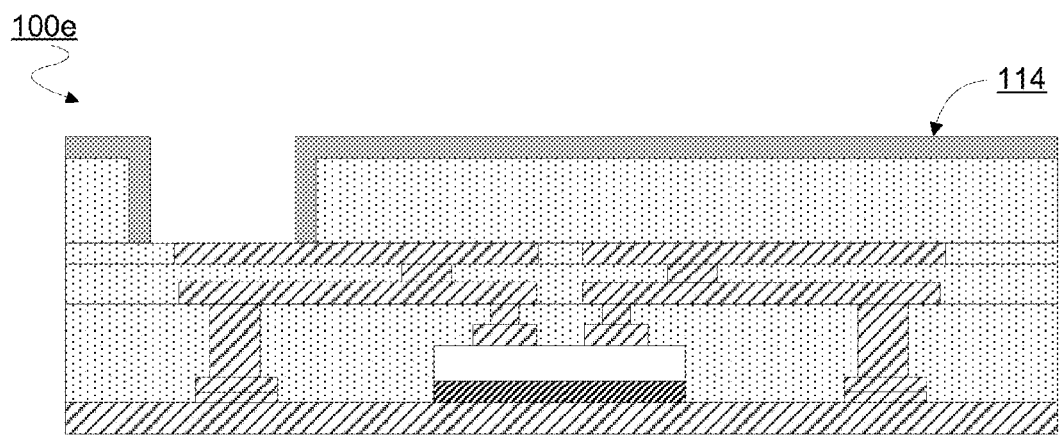
Figure 1F:
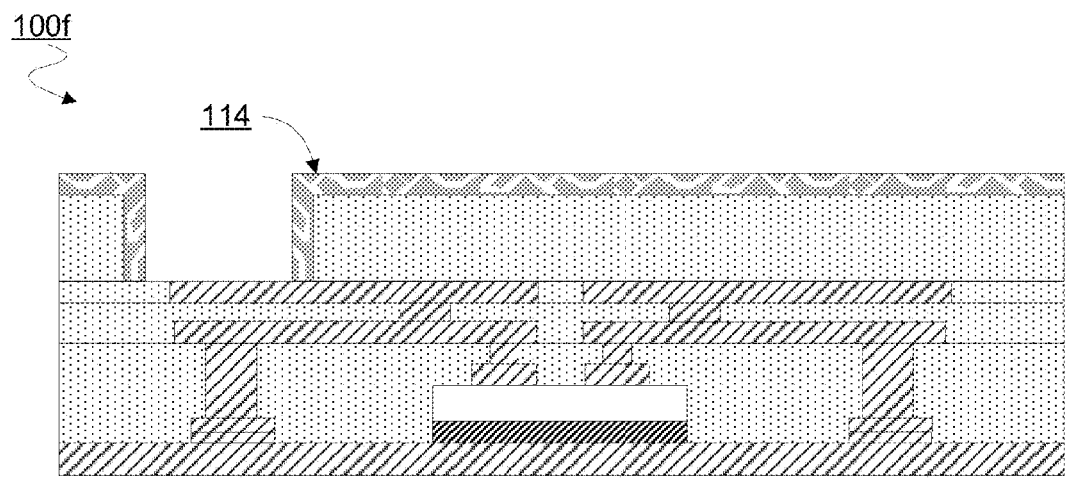

In an embodiment, a lamination process is performed—as illustrated in view 100e of FIG. 1E—to dispose an organic dielectric film 114 on BBUL MEMS bottom sacrificial layer 108. Organic dielectric film 114 may include some or all of the features of any of various Ajinomoto Build-up Film (ABF) products. For example, film 114 may include a layer of resinous or otherwise organic dielectric material. Alternatively or in addition, organic dielectric film 114 may include structures and/or materials providing one or more characteristics—e.g. including particular desmear, swelling and/or etch response properties—to facilitate fabrication processing of a seed Cu layer. For example, organic dielectric film 114 may include silica particles or other embedded fillers (not shown) which provide precise control over a level of swelling, desmearing and/or etching. Alternatively or in addition, organic dielectric film 114 may include a release layer including polyethylene terephthalate (PET) or any of various other polymers to provide for selective exposure of the dielectric material to fabrication processes.

For example, after removal of any such release layer, organic dielectric material of film 114 may be subjected to a controlled swelling process—e.g. using an organic acid such as alkoxy-ethanol or any of various other alkaline based swellers. Such controlled swelling may lead to formation of a swelling zone on and/or through organic dielectric film 114. Subsequent to such swelling, desmearing may be performed to prepare the surface of organic dielectric material of film 114 at least in part for a material—e.g. a seed copper layer 116—to be subsequently disposed thereon. For example, desmearing of organic dielectric film 114 may include operations to variously form pockets or other such indentation structures in the desmeared surface. Alternatively or in addition, such desmearing may be performed at least in part to remove residue such as that generated by the laser drill operation which forms walls 109. Certain embodiments avail of one or more engineered properties of organic dielectric film 114 to allow for swelling and/or desmear processes which may be controlled at a level of a few microns or even sub-micron levels. By way of illustration and not limitation, the controlled desmear may generate a swelling layer in organic dielectric film 114 which is equal to or less than three (3) microns.

Conventional desmear techniques form indentation structures to provide mechanical anchoring points for a material to be subsequently disposed thereon. However, certain embodiments include further performing a controlled desmear etch to create tunnels of porosity in organic dielectric material of film 114, as illustrated in view 100f of FIG. 1F. For example, etching of the organic dielectric material of film 114 may join pockets generated by the desmear process to variously form tunnels within the organic dielectric material. The resulting tunnels may actually serve to reduce the mechanical anchoring which might otherwise be provided for Cu seed layer 116. However, such tunnels may provide pathways to increase exposure of Cu seed layer 116 to removal by a subsequent etching.

Figure 1G:
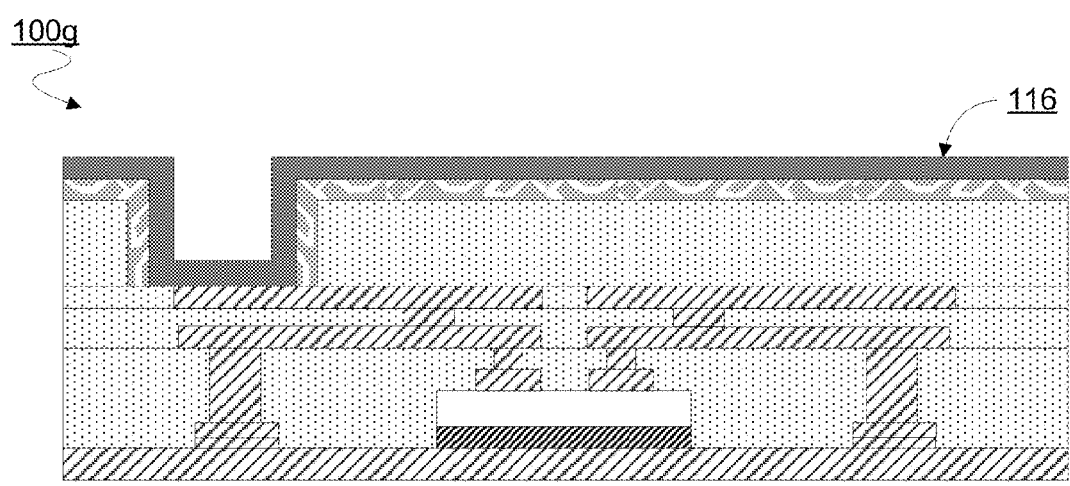
Figure 1H:
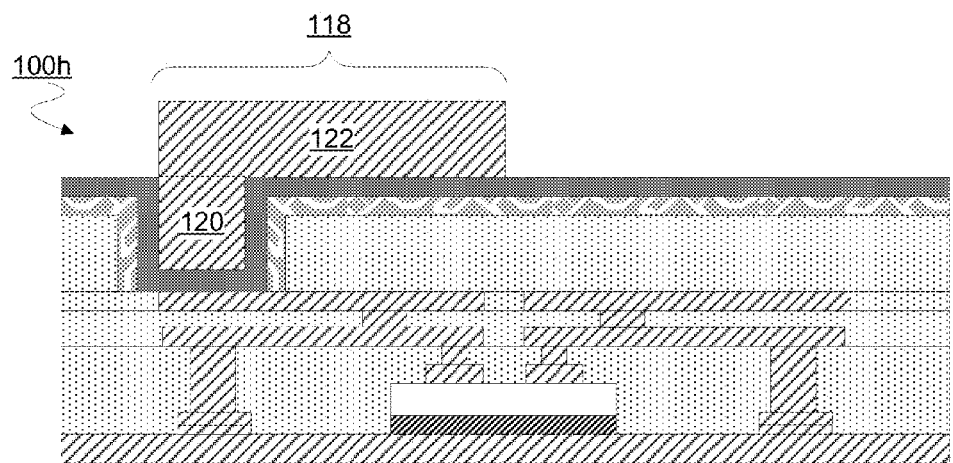
Figure 1I:
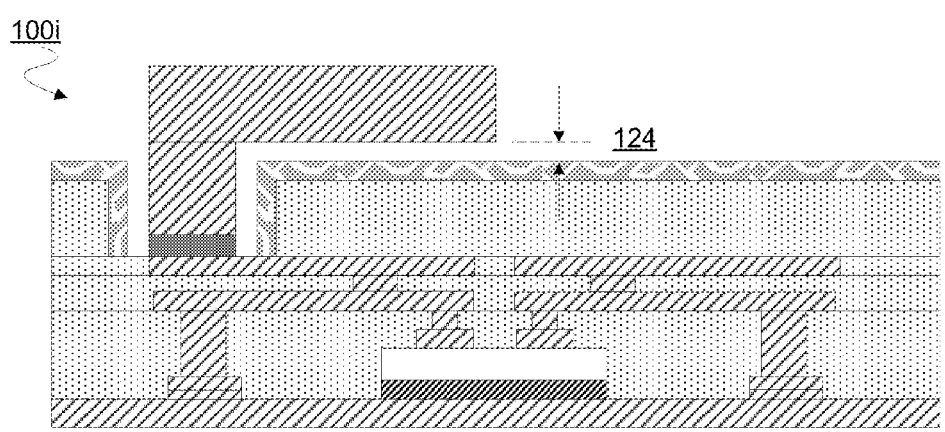

Subsequent to the swelling and desmear etching to form tunnels of porosity in organic dielectric film 114, a seed copper layer 116—as depicted in view 100g of FIG. 1G—may be formed by an electroless copper plating process, for example. A BBUL MEMS structure 118 (e.g., including an anchor 120 and cantilever 122) is then fabricated, e.g., by patterned dry film resistor (DFR) patterning and copper electroplating on electroless copper layer 116, as depicted in view 100h in FIG. 1H.

Subsequently, some or all of electroless copper layer 116 may be removed, e.g., by a controlled flash etch, to form a gap 124 between a bottom side of BBUL MEMS structure 118 and a layer disposed underneath that BBUL MEMS structure 118. In an embodiment, the tunnels of porosity of organic dielectric film 114 provide for improved etching to remove a portion of electroless copper layer 116 from under a bottom side of cantilever 122. Additionally or alternatively, such tunnels of porosity provide for improved removal of seed copper within the gap defined by walls 109. Due to improved selective etching through tunnels of porosity in the organic dielectric material of film 114, certain embodiments provide for precise control of the height of the resulting gap 124. For example, the height of gap 124 may be controlled on the level of a few microns and even on a submicron level. By way of illustration and not limitation, gap 124 may be equal to or less than three (3) microns, in one embodiment.

In an embodiment, an active surface of semiconductor die 104 includes a plurality of semiconductor devices, such as but not limited to transistors, capacitors and resistors interconnected together by a die interconnection structure into functional circuits to thereby form an integrated circuit. As will be understood to those skilled in the art, the device side of the semiconductor die 104 may include an active portion with integrated circuitry and interconnections. The semiconductor die may be any appropriate integrated circuit device including but not limited to a microprocessor (single or multi-core), a memory device, a chipset, a graphics device, an application specific integrated circuit according to several different embodiments. In another embodiment, more than one die is embedded in the same package. For example, in one embodiment, a packaged semiconductor die further includes a secondary stacked die. The first die may have one or more through-silicon vias disposed therein (TSV die). The second die may be electrically coupled to the TSV die through the one or more through-silicon vias. In one embodiment, both dies are embedded in a coreless substrate.

The packaged semiconductor die 104 may, in an embodiment, be a fully embedded and surrounded semiconductor die. As used in this disclosure, "fully embedded and surrounded" means that all surfaces of the semiconductor die are in contact with an encapsulating film (such as a dielectric layer) of substrate, or at least in contact with a material housed within the encapsulating film. Said another way, "fully embedded and surrounded" means that all exposed surfaces of the semiconductor die are in contact with the encapsulating film of a substrate.

The packaged semiconductor die 104 may, in an embodiment, be a fully embedded semiconductor die. As used in this disclosure, "fully embedded" means that an active surface and the entire sidewalls of the semiconductor die are in contact with an encapsulating film (such as a dielectric layer) of a substrate, or at least in contact with a material housed within the encapsulating film. Said another way, "fully embedded" means that all exposed regions of an active surface and the exposed portions of the entire sidewalls of the semiconductor die are in contact with the encapsulating film of a substrate. However, in such cases, the semiconductor die may or may not be "surrounded" insofar as the backside of the semiconductor die is not in contact with an encapsulating film of the substrate or with a material housed within the encapsulating film. In a first embodiment, a back surface of the semiconductor die protrudes from the global planarity surface of the die side of a substrate. In a second embodiment, no surface of the semiconductor die protrudes from the global planarity surface of the die side of a substrate.

In contrast to the above definitions of "fully embedded and surrounded" and "fully embedded," a "partially embedded" die is a die having an entire surface, but only a portion of the sidewalls, in contact with an encapsulating film of a substrate (such as a coreless substrate), or at least in contact with a material housed within the encapsulating film. In further contrast, a "non-embedded" die is a die having at most one surface, and no portion of the sidewalls, in contact with an encapsulating film of a substrate (such as a coreless substrate), or in contact with a material housed within the encapsulating film.

In an embodiment, an array of external conductive contacts (not shown) may subsequently be formed. The external conductive contacts may couple the formed substrate to a foundation substrate. The external conductive contacts may be used for electrical communication with the foundation substrate. In one embodiment, the array of external conductive contacts is a ball grid array (BGA). In other embodiments, the array of external conductive contacts is an array such as, but not limited to, a land grid array (LGA) or an array of pins (PGA). In an embodiment, as described above, the substrate is a BBUL substrate. Although described in detail above for a BBUL process, other process flows may be used instead. For example, in another embodiment, die 104 is housed in a core of a substrate. In another embodiment, fan-out layers are used.

The term "MEMS" generally refers to an apparatus incorporating some mechanical structure having a dimensional scale that is comparable to microelectronic devices. The mechanical structure is typically capable of some form of mechanical motion and having dimensions below approximately 250 microns. In an embodiment, a MEMS on package structure has a total size exceeding approximately 1 mm, but has a beam width on an order of up to ten microns or a few tens of microns. However, as successive generations of semiconductor packages continue to scale with improved fabrication technologies, the overall size of the MEMS on package structures are expected to scale below 1 mm, and MEMS beam widths are expected to scale to ten microns or less. Thus, MEMS structures contemplated herein are, in an embodiment, any device that falls within the scale of such MEMS technologies. For example, a MEMS structure may be any mechanical and electronic structure having a critical dimension of less than approximately 250 microns and fabricated using lithography, deposition, and etching processes above a substrate. In accordance with an embodiment of the present invention, the MEMS structure is a device such as, but not limited to, a resonator, a sensor, a detector, a filter or a mirror. In one embodiment, the MEMS structure is a resonator. In a specific embodiment, the resonator is one such as, but not limited to, a beam, a plate and a tuning fork or a cantilever arm.

Figure 2B:
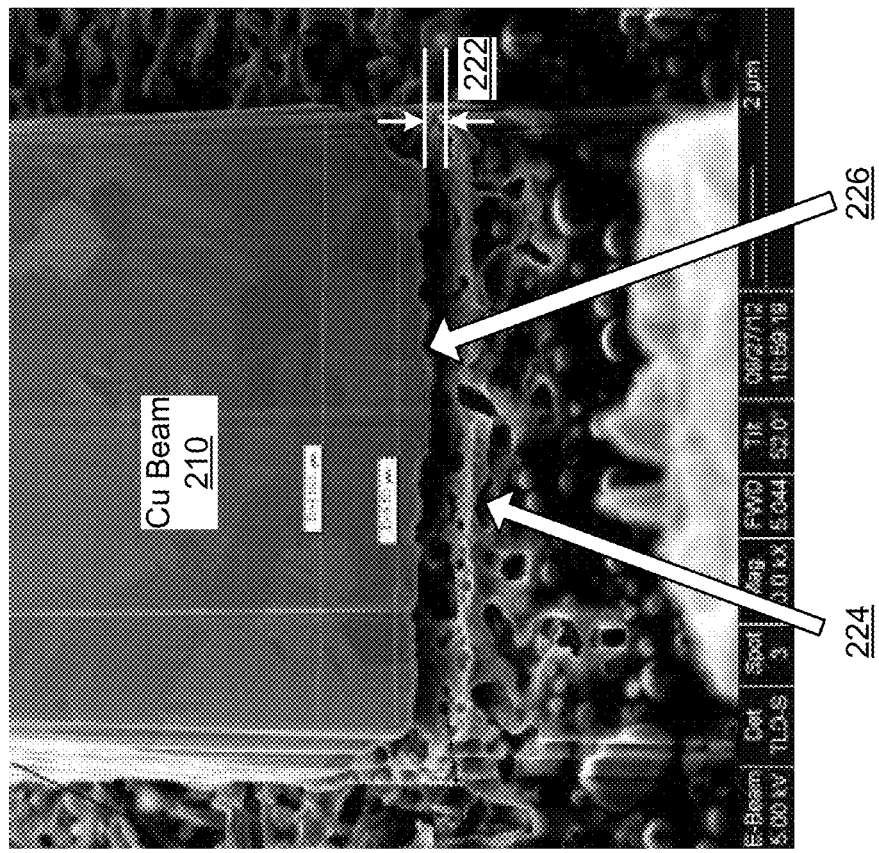
FIGS. 2A-2C include scanning electron microscope (SEM) images of a packaged MEMS device according to an embodiment.
Figure 2A:
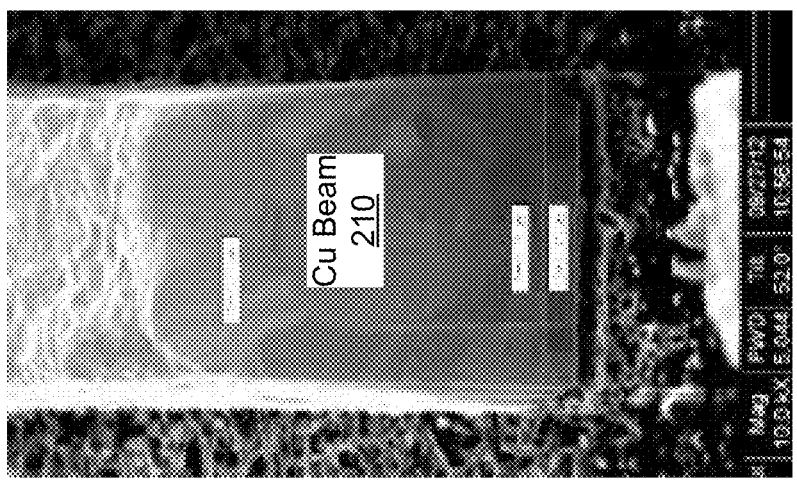

Referring now to FIG. 2A, a MEMS device according to an embodiment is shown in an electron scanning microscope (ESM) view 200. A detailed view 220 of the MEMS device is shown in FIG. 2B. The MEMS device shown in views 210, 220 includes a copper beam 210 which, for example, has some or all of the features of cantilever 122. Copper beam 210 may serve as an active element for motion sensor, accelerometer, temperature sensor, pressure sensor, or the like. As shown in view 220, copper beam 210 may be separated from an underlying layer by a gap 222. In an embodiment, gap 222 is equal to or less than 3 microns. By contrast, the width and/or height of copper beam 210 at a location over gap 222 may be significantly larger than gap 222—e.g. by a factor of ten (10) or more.

In an embodiment, one or more materials, structures and/or dimensions the semiconductor package result from fabrication of the semiconductor package according to the process illustrated by FIGS. 1A-1I. By way of illustration and not limitation, a region 224 under copper beam 210 may include an organic dielectric material which has tunnels of porosity formed therein. Such tunnels may be formed by swelling, desmear and etch processing such as those discussed herein with reference to the organic dielectric material of film 114. Alternatively or in addition, such processing may be indicated by a rough underside 226 of copper beam 210. In one embodiment, any release hole of the MEMS device extends through a structure other than copper beam 210.

Figure 2C:
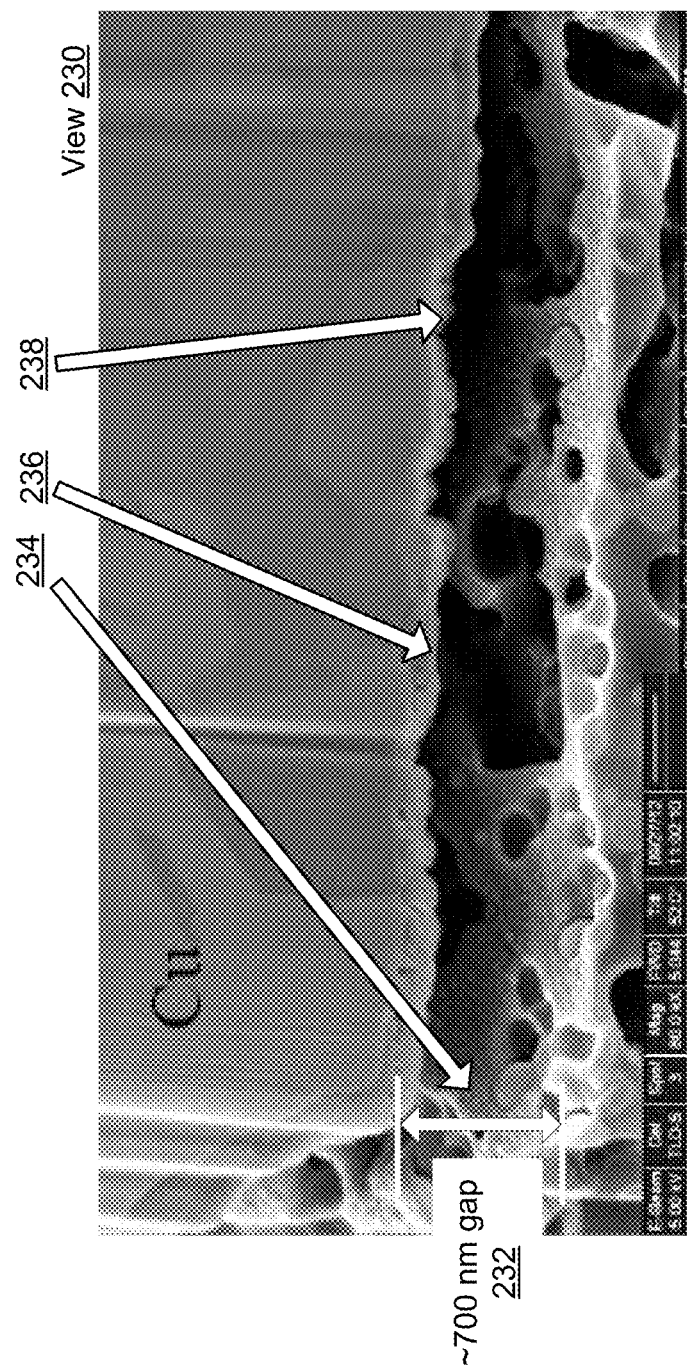

Referring now to FIG. 2C, another ESM view 230 of a MEMS device according to an embodiment is shown. The MEMS device in view 230 may include some or all of the features of the MEMS device in views 210, 220. In view 230, a copper beam is suspended over an underlying organic dielectric layer by a gap 232 which, for example, is about 700 nanometers high. Tunnels of porosity 234 in the organic dielectric layer result from processing such as that shown in FIGS. 1A-1I. Rough regions 236, 238 of residual seed copper are also a result of seed layer etching though tunnels 234 to form gap 232.

As discussed herein, certain embodiments additionally or alternatively form of one or more surfaces which are each prepared in one or more respects for the application—e.g. lamination, sputtering, plating and/or the like—of a respective next successive build-up layer. Such preparation may allow for a smooth surface of a metal structure of the semiconductor package and/or for precise formation of a relatively small gap between structures of the semiconductor package. Such preparation may include application of an ABF or other such film including an organic dielectric material layer and a release layer, where the release layer of the applied film is removed only after a desmear operation. Alternatively or in addition, the preparation may include application of another dielectric film including a silicon nitride material. As used herein, "silicon nitride material" refers to any of a variety of dielectric materials which include some compound of silicon and nitrogen including, but not limited to, Silicon Nitride (SiN), Silicon Oxynitride (SiON), Silicon Carbide Nitride (SiCN) or the like.

A packaged integrated circuit device may be housed in any of a variety of packaging options according to different embodiments. One such option is housing in a substrate formed by a BBUL process having, for example, some or all of the features discussed with respect to FIGS. 1A-1I. By way of illustration and not limitation, FIGS. 3A-3I illustrate cross-sectional views of various operations in a process of fabricating a packaged integrated circuit device in accordance with an embodiment.

Figure 3A:
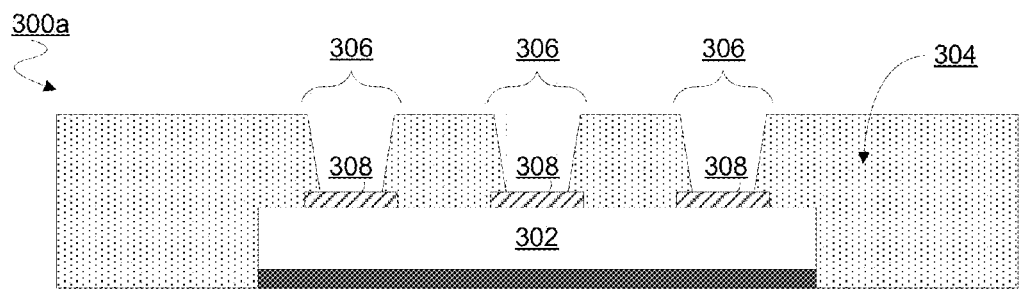
FIGS. 3A-3I illustrate cross-sectional views of various operations of a process to fabricate low roughness structures of a packaged device according to an embodiment.

As shown in view 300a of FIG. 3A, a die 302 may be embedded in one or more encapsulation layers which, for example, are formed by a lamination process and/or by a spinning and curing of one or more dielectric materials. For example, embedding of die 302 may have some or all of the features of an embedding of die 104 in view 100b. The one or more encapsulation layer are represented in view 300a by an illustrative layer 304.

One or more holes 306 through layer 304 may be formed—e.g. with $CO_2$ laser or UV laser drilling—to expose conductive contacts 308 for die 302. A desmear operation may be performed to roughen some portion of the surface of layer 304. Alternatively or in addition, such a desmear operation may remove residue resulting from the formation of holes 306. Certain embodiments provide for protection of at least part of the surface of layer 304 from such roughening. For example, some or all of the remaining surface of layer 304 may be covered during such desmear processing by a release layer (not shown) which is subsequently removed.

Figure 3B:
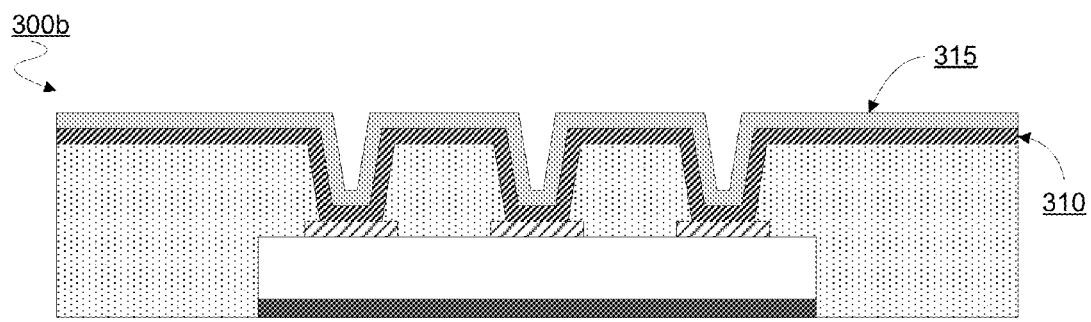

View 300b of FIG. 3B show a layer 310 of titanium which, in an embodiment, may be disposed onto the surface of layer 304—e.g. through a physical vapor deposition (PVD) process. Ti layer 310 may provide for reduction of the surface roughness of a subsequently formed metal structure and/or promote adhesion of such a metal structure to a dielectric material. The thickness of Ti layer 310 may be on the order of 100 nm—e.g. in a range between 50 nm-200 nm. However, the thickness of Ti layer 310 may be on an order of 500 Å, in another embodiment. A seed layer 315 of copper may be subsequently disposed onto Ti layer 310 using PVD, for example. The thickness of seed layer 315 may be similar to that of Ti layer 310, although certain embodiments are not limited in this regard.

Figure 3C:
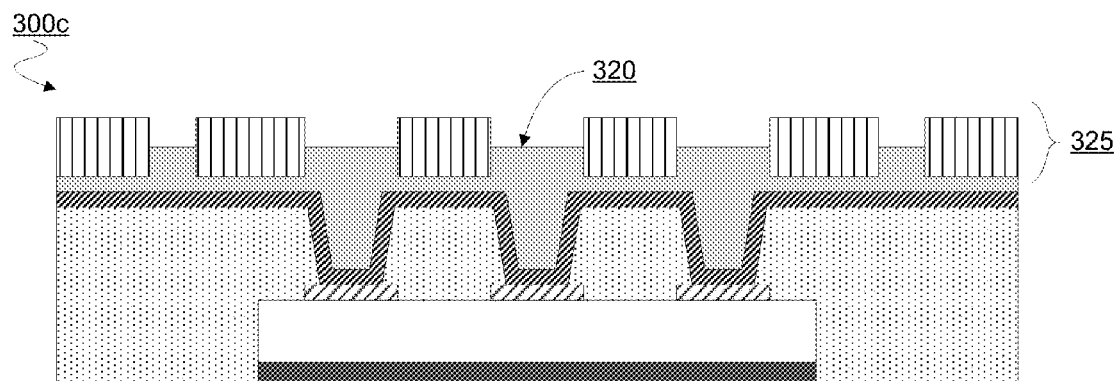
Figure 3D:
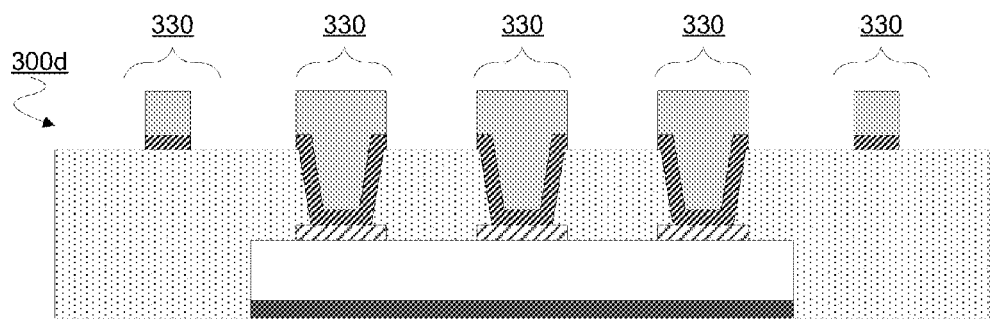

As shown in view 300c of FIG. 3C, lamination and photo-patterning of a dry film resist (DFR) layer 325 (or other patterning material layer) may be performed to define a pattern for subsequent electroless plating of copper 320 on top of seed layer 315. Removal of the patterned DFR layer 325 may be followed by etching—e.g. including plasma or flash etching—to form one or more contacts 330 of a metal layer, as illustrated in view 300d of FIG. 3D. An area of the semiconductor package to be exposed to such etching may be limited or otherwise defined with any of a variety of etch resist structures (not shown) adapted from conventional techniques. In an embodiment, contacts 330 are to variously provide conductive pathways to respective vias, signal lines or other structures. Additionally or alternatively, some or all of contacts 330 are to be subsequently formed into one or more MEMS structures.

Figure 3E:
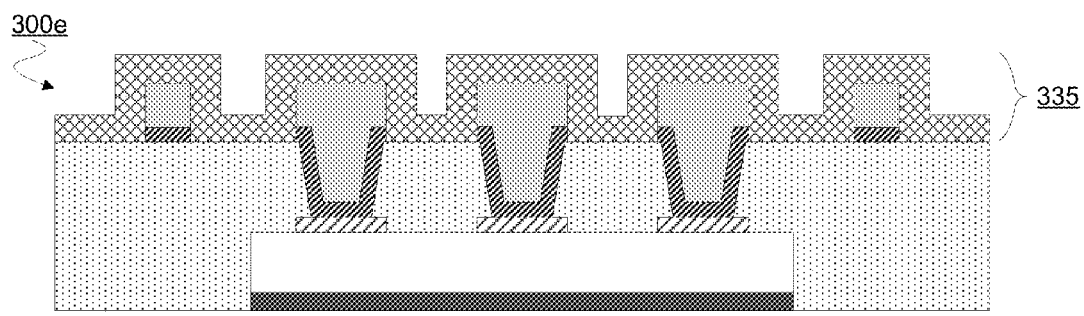

Referring now to view 300e of FIG. 3E, a film 335 of dielectric silicon nitride material may be disposed over contacts 330—e.g. with a plasma-enhanced chemical vapor deposition (PECVD) process. Film 335 may have a thickness of up to a few hundred nanometers, in one embodiment. For example, the thickness of film 335 may be in a range of 100-500 nm. In an embodiment, film 335 includes a compound of silicon and nitrogen, such as SiN, SiCN, SiON or the like, which exhibits low loss dielectric properties. Film 335 may provide for improved adhesion of copper in contacts 330 to a film 340 to be disposed thereon. Film 335 may further protect one or more surfaces of layer 304 and/or contacts 330 from being roughened by subsequent fabrication operations. Alternatively or in addition, film 335 may provide for improved control in the formation of a gap between a MEMS structure (e.g. a proof mass, resonator, cantilever or the like) and an underlying or otherwise proximate surface of the semiconductor package.

Figure 3F:
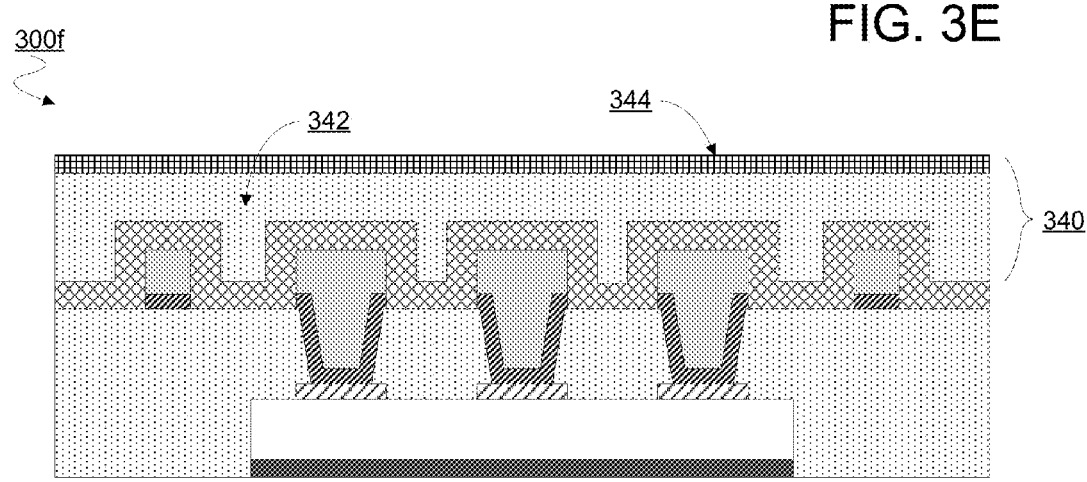
Figure 3G:
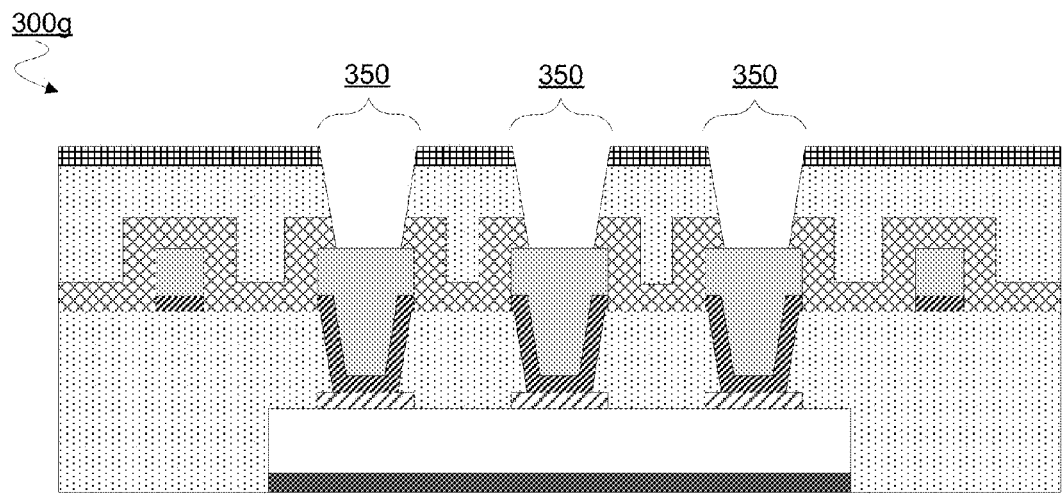
Figure 3H:
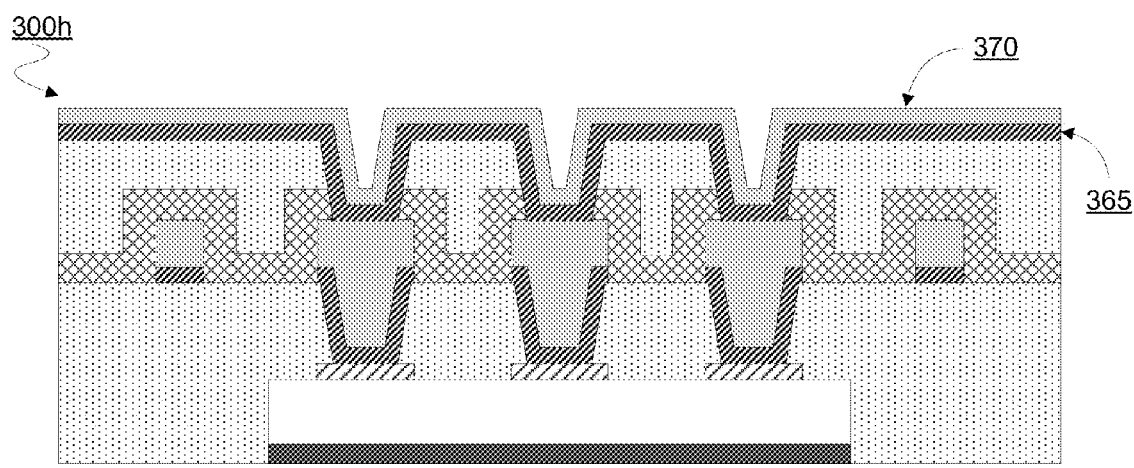
Figure 3I:
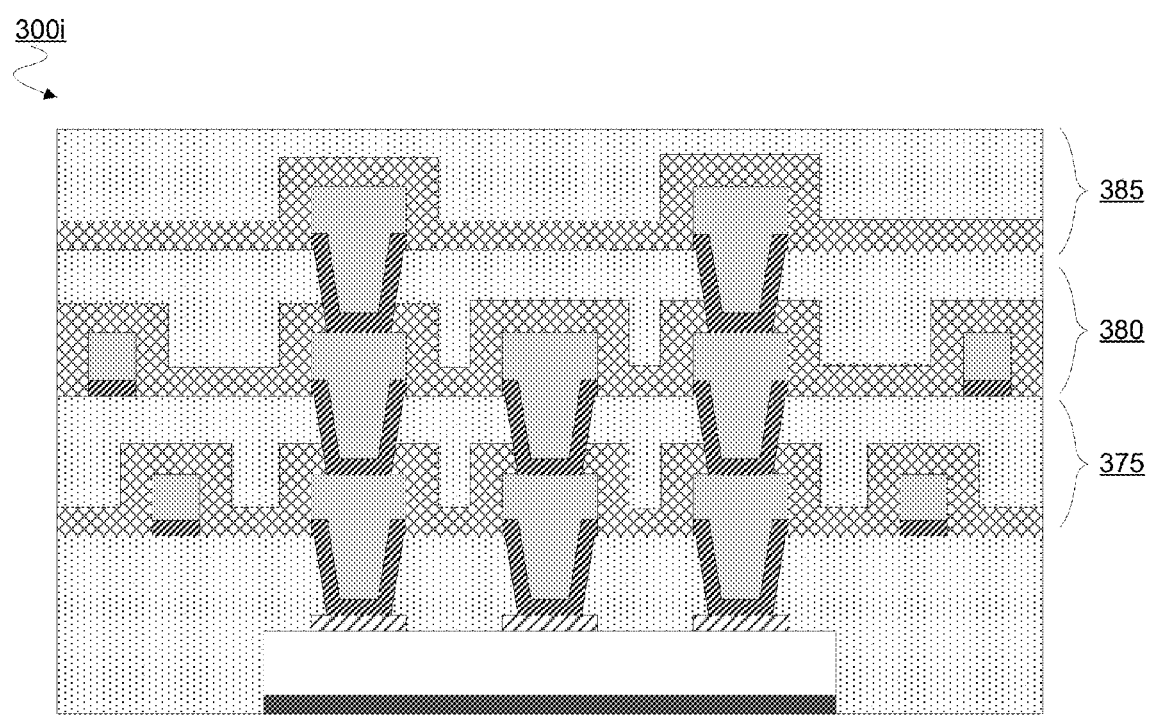

As shown in view 300f of FIG. 3F, another film 340 including an organic dielectric material may be adhered, pressed or otherwise laminated over film 334. Film 340 may include some or all of the features of organic dielectric film 114, for example. By way of illustration and not limitation, film 114 may include a layer 342 including organic dielectric material such as that of an ABF. Film 340 may further comprise a release layer 344 which, for example, comprises polyethylene terephthalate (PET) or any of various other polymers and a release agent for subsequent separation of the polymer from layer 342.

Release layer 344 may provide for at least partial protection of dielectric layer 342 from a desmearing process which takes place subsequent to lamination of film 340. Areas of dielectric layer 342 which are protected from such desmear processing may subsequently contribute to the smoothness of one or more metal surfaces of the semiconductor package. For example, as shown in view 300g of FIG. 3G, one or more holes 350 through layers 342, 344 may be formed— e.g. with $CO_2$ laser or UV laser drilling—to expose some or all of contacts 330. A desmear operation may be performed, for example, to roughen the exposed contacts 330 and/or to remove residue resulting from the formation of holes 350.

Subsequent to the desmear process, some or all of layer 344 may be peeled off to expose a comparatively smooth surface of the organic dielectric material of layer 342. Referring now to view 300h of FIG. 3H, a thin layer 365 of Ti may be disposed onto the exposed material of layer 342—e.g. as an adhesion layer to promote adhesion of a subsequently formed Cu seed layer 370. The formation of layers 365, 370 may be according to techniques discussed herein with respect to layers 310, 315. Thereafter, subsequent plating may be performed to dispose additional copper over seed layer 370 to form a next metal layer—e.g. according to the techniques discussed with respect to the plating of copper 320. For example, some or all of the operations of FIGS. 3A-3H may be variously repeated to form the illustrative layers 375, 380, 385 in view 300i of FIG. 3I. The particular number and configuration of layers 375, 380, 385 is merely illustrative, and not limiting on certain embodiments.

Operations such as those illustrated by FIGS. 3A-3I provide an alternative to current techniques wherein desmearing is performed to roughen a surface of a metal structure to enable subsequent adhesion of a laminate or other film to that metal structure. Such operations allow for an antenna or other such metal structure to adhere to a low loss dielectric (for example), while allowing such adhesion to be at a smooth surface of the metal structure. In conventional techniques, it is typical for the surface of dielectric material in a semiconductor package to have a roughness average (Ra) which is at or above 350 nm at a dielectric-metal interface. By contrast, certain embodiments use a release layer structure—e.g. of an ABF or any of various other engineered dielectric films—to protect a dielectric material from desmear processing. Consequently, roughness averages on the order of 140 nm to below 45 nm may be achieved for dielectric materials prepared according to various embodiments. One result is that smooth metal antenna surfaces (e.g. both upper and lower metal surfaces) with an optional air gap surrounding such antennas surfaces may be provided to allow link/interface hardware to operate at higher bandwidths.

FIGS. 4A-4I illustrate cross-sectional views of various operations in a process of fabricating a packaged integrated circuit device in accordance with an embodiment. Although certain embodiments are not limited in this regard, such operations may be performed in addition to, or as an alternative to, one or more operations illustrated by FIGS. 3A-3I.

Figure 4A:
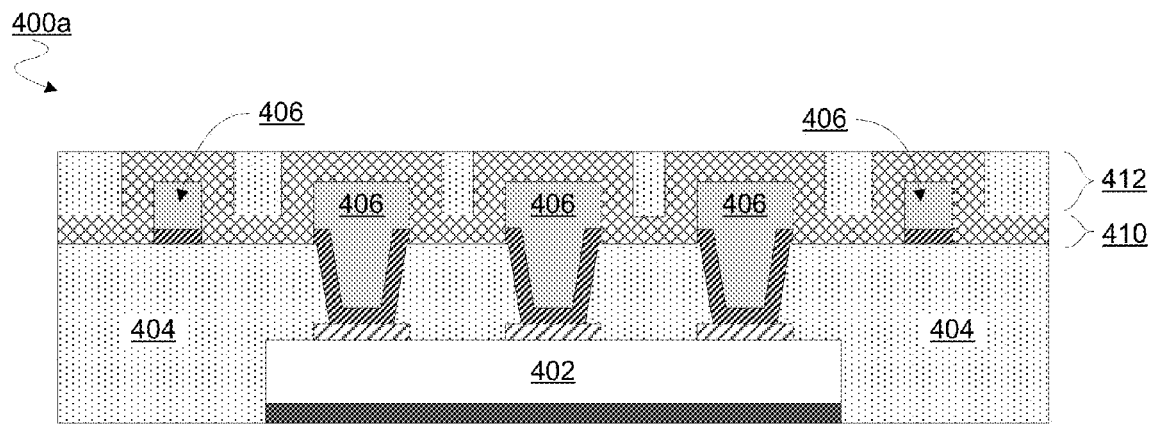
FIGS. 4A-4D illustrate cross-sectional views of various operations of a process to fabricate low roughness structures of a packaged MEMS device according to an embodiment.

For example, as shown in view 400a of FIG. 4A, a die 402 may be embedded in one or more encapsulation layers, represented by the illustrative layer 404. One or more copper structures 406 may each be disposed on a surface of layer 404. Although certain embodiments are not limited in this regard, some or all such copper structures 406 may be disposed over respective vias which variously extend through layer 404 to corresponding contacts for die 402 or, alternatively, to a next lower metal layer (not shown) over die 402.

In an embodiment, such vias and/or some or all of the one or more copper structures 406 may be formed in part by disposing a thin layer of titanium for adhesion of a subsequent copper seed layer—e.g. according to techniques discussed with respect to layers 365, 370. Subsequently, electroless plating of additional copper may be performed to build the rest of the one or more copper structures 406. A film 410 of a dielectric silicon nitride material may be disposed over copper structures 406, and another dielectric material 412 may be disposed over film 410. In an embodiment, film 410 has some or all of the features of film 335 and/or dielectric material 412 may include some or all of the features of layer 342. Certain embodiments variously provide at least partial protection of the surface of layer 404 from a desmear process prior to the fabrication of the one or more copper structures 406. For example, layer 404 may be protected from exposure to desmearing by techniques and mechanisms such as those described herein for protecting layer 342.

Figure 4B:
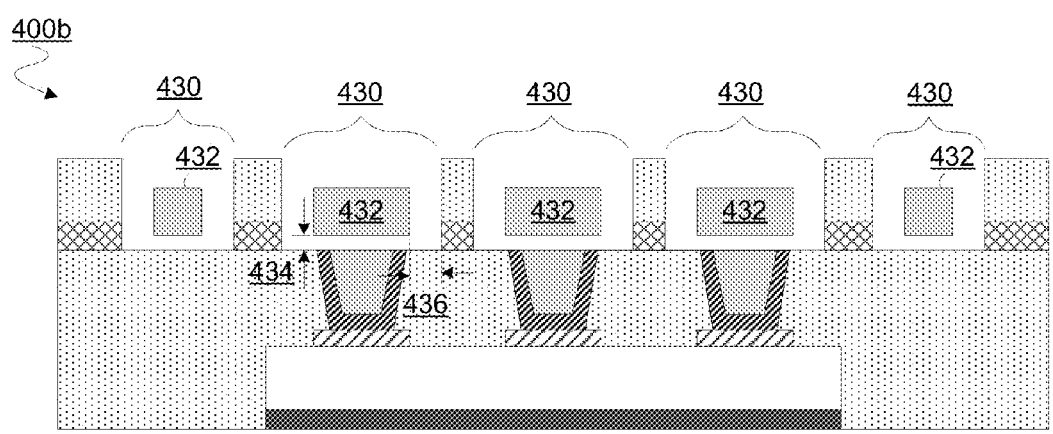
Figure 4C:
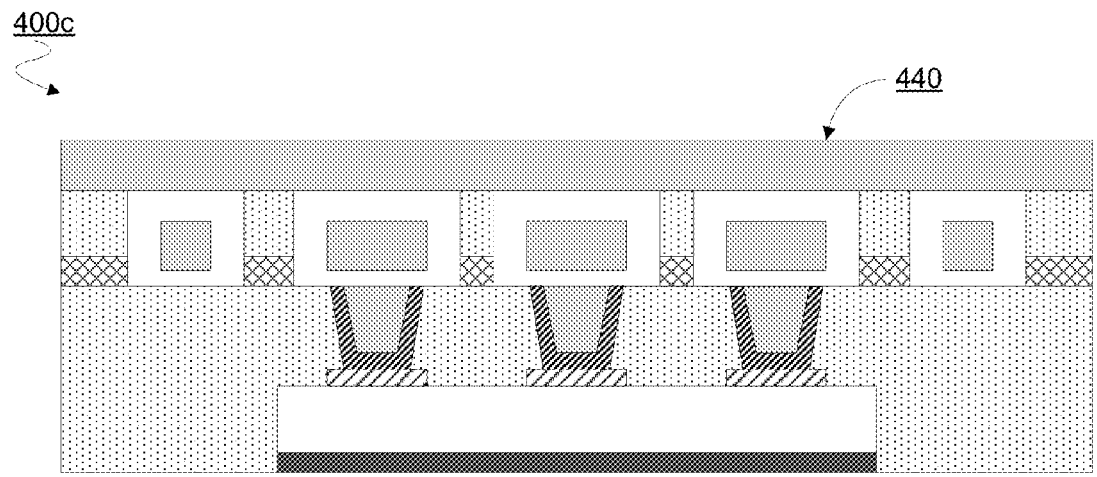
Figure 4D:
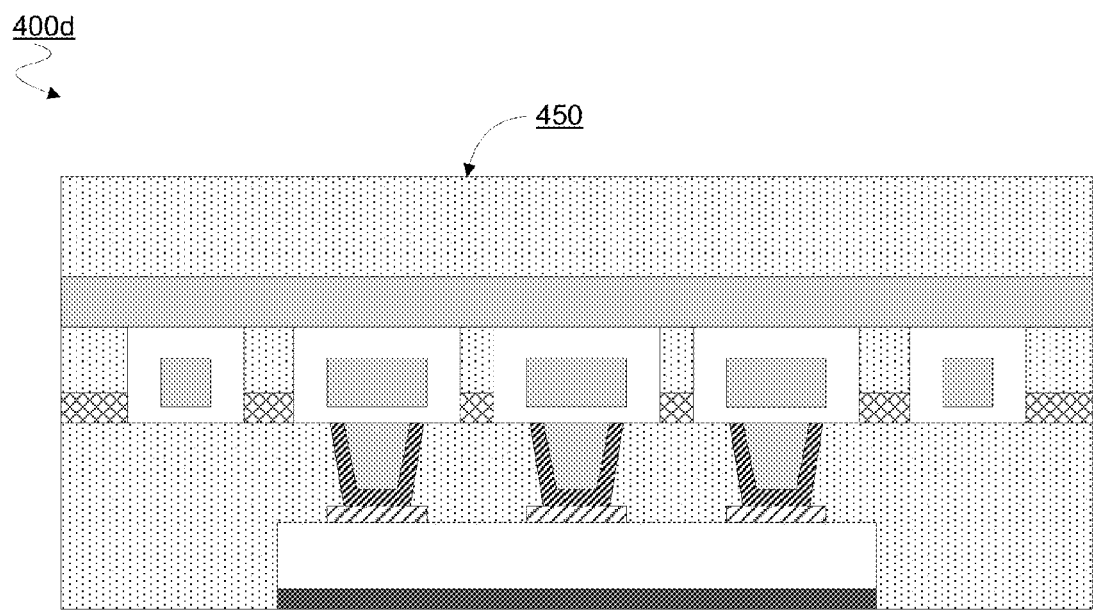

As shown in view 400b of FIG. 4B, selectively etching may be performed to expose and remove at least portions of the silicon nitride material in film 410 which variously adjoin the one or more copper structures 406. Such etching may additionally remove portions of the titanium underlying one or more copper structures 406 and/or portions of the one or more copper structures 406. As a result of such etching, one or more suspended structures 432 may be variously formed between portions of film 410 and/or portions of dielectric material 412—e.g. where one or more suspended structures 432 are exposed in respective openings 430 of dielectric material 412. The one or more suspended structures 432 may be variously suspended by other portions (not shown) of film 410, dielectric material 412 and/or other elements of the semiconductor package which were not exposed. Consequently, one or more gaps 434, 436 may variously separate a suspended structure 432 from respective proximate structures of the IC device.

In an embodiment, additional layers and/or other structures may be formed to couple, anchor, protect etc. the one or more suspended structures 432. By way of illustration and not limitation, a layer 440 of copper foil may be laminated over the one or more openings 430, as shown in view 400c of FIG. 4C. Alternatively or in addition, an additional dielectric layer 450—e.g. including any of a variety of ABF products—may be rolled, pressed or otherwise laminated over layer 440, as shown in view 400d of FIG. 4D.

Figure 5:
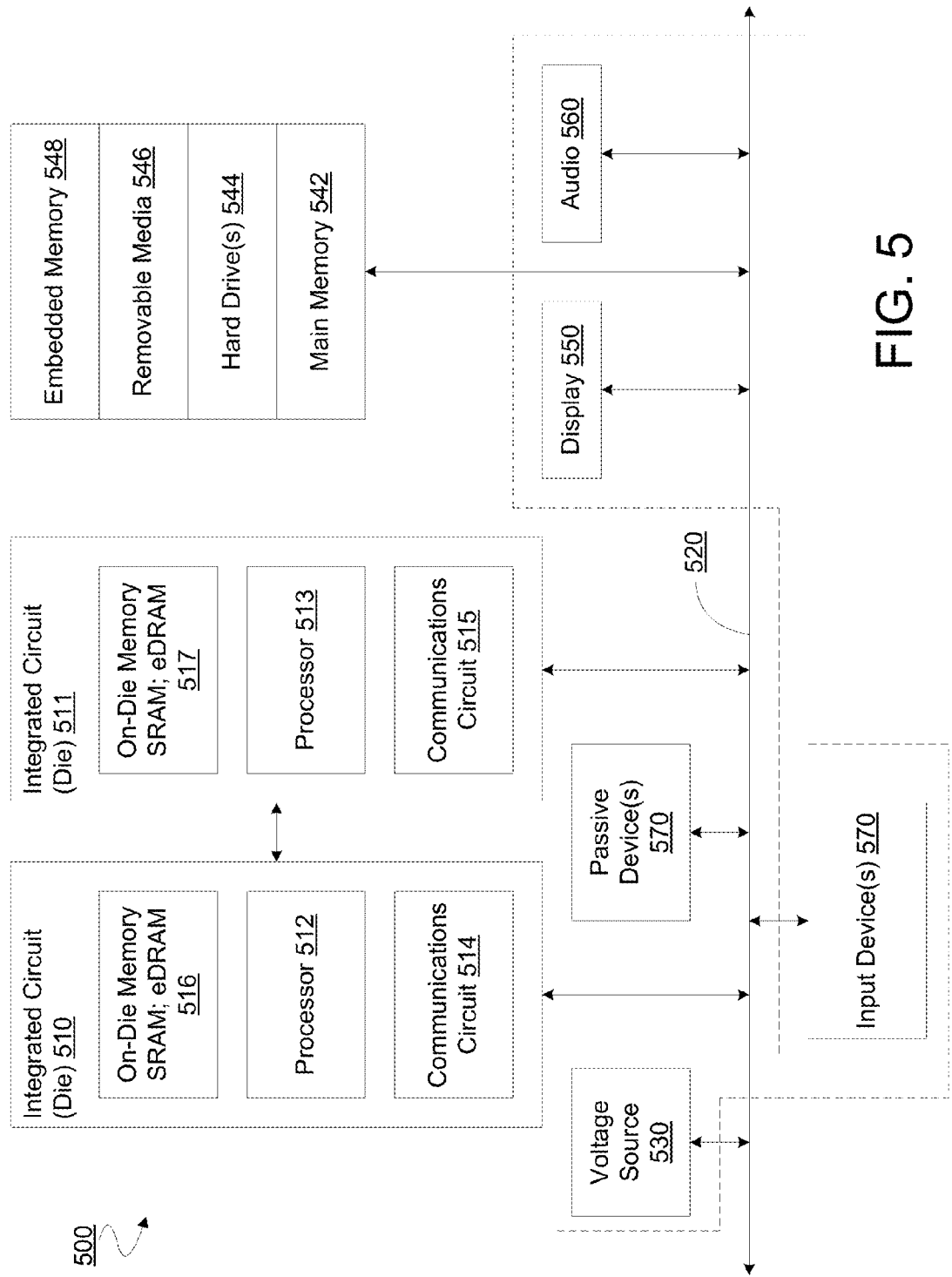
FIG. 5 is a schematic of a computer system, in accordance with one embodiment.

FIG. 5 is a schematic of a computer system 500, in accordance with an embodiment of the present invention. The computer system 500 (also referred to as the electronic system 500) as depicted can embody a semiconductor package having a mechanical fuse therein according to any of the several disclosed embodiments and their equivalents as set forth in this disclosure. The computer system 500 may be a mobile device such as a netbook computer. The computer system 500 may be a mobile device such as a wireless smart phone. The computer system 500 may be a desktop computer. The computer system 500 may be a hand-held reader.

In an embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In some embodiments, the voltage source 530 supplies current to the integrated circuit 510 through the system bus 520.

The integrated circuit 510 is electrically coupled to the system bus 520 and includes any circuit, or combination of circuits according to an embodiment. In an embodiment, the integrated circuit 510 includes a processor 512 that can be of any type. As used herein, the processor 512 may mean any type of circuit such as, but not limited to, a microprocessor, a microcontroller, a graphics processor, a digital signal processor, or another processor. In an embodiment, the processor 512 includes or is included in a semiconductor package having a mechanical fuse therein, as disclosed herein. In an embodiment, SRAM embodiments are found in memory caches of the processor. Other types of circuits that can be included in the integrated circuit 510 are a custom circuit or an application-specific integrated circuit (ASIC), such as a communications circuit 514 for use in wireless devices such as cellular telephones, smart phones, pagers, portable computers, two-way radios, and similar electronic systems. In an embodiment, the processor 510 includes on-die memory 516 such as static random-access memory (SRAM). In an embodiment, the processor 510 includes embedded on-die memory 516 such as embedded dynamic random-access memory (eDRAM).

In an embodiment, the integrated circuit 510 is complemented with a subsequent integrated circuit 511. Useful embodiments include a dual processor 513 and a dual communications circuit 515 and dual on-die memory 517 such as SRAM. In an embodiment, the dual integrated circuit 510 includes embedded on-die memory 517 such as eDRAM.

In an embodiment, the electronic system 500 also includes an external memory 540 that in turn may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory drives, and other removable media known in the art. The external memory 540 may also be embedded memory 548 such as the first die in an embedded TSV die stack, according to an embodiment.

In an embodiment, the electronic system 500 also includes a display device 550 and an audio output 560. In an embodiment, the electronic system 500 includes an input device such as a controller 570 that may be a keyboard, mouse, trackball, game controller, microphone, voice-recognition device, or any other input device that inputs information into the electronic system 500. In an embodiment, an input device 570 is a camera. In an embodiment, an input device 570 is a digital sound recorder. In an embodiment, an input device 570 is a camera and a digital sound recorder.

As shown herein, the integrated circuit 510 may be implemented in a number of different embodiments, including a semiconductor package having a mechanical fuse therein according to any of the several disclosed embodiments and their equivalents, an electronic system, a computer system, one or more methods of fabricating an integrated circuit, and one or more methods of fabricating an electronic assembly that includes a semiconductor package having a mechanical fuse therein according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor package having a mechanical fuse therein embodiments and their equivalents. A foundation substrate may be included, as represented by the dashed line of FIG. 5. Passive devices may also be included, as is also depicted in FIG. 5. In one implementation, a semiconductor package comprises a die, a build-up carrier coupled to the die, the build-up carrier comprising a plurality of build-up layers including a first layer of porous dielectric material, and a MEMS device having a suspended copper portion anchored by the plurality of build-up layers, wherein a gap separates the suspended copper portion from an exposed surface of the first layer of porous dielectric material.

In an embodiment, the gap separates the suspended copper portion from the exposed surface by a distance equal to or less than three microns. In another embodiment, a portion of the suspended copper portion above the gap has a thickness of over 30 microns. In another embodiment, the porous dielectric material comprises an organic resin. In another embodiment, the build-up carrier comprises a plurality of alternating layers of patterned conductive material and insulating material, wherein at least one of the layers of patterned conductive material couples the MEMS device to a contact point of the die. In another embodiment, the layer of porous dielectric material has tunnels formed therein, wherein residual copper is disposed within the tunnels.

In another implementation, a method comprises forming a first portion of a build-up carrier for a die, including forming a layer of porous dielectric material, disposing a seed layer on the layer of porous dielectric material, plating copper on the seed layer, and after plating the copper, etching copper adjacent to the layer of porous dielectric material to form a suspended portion of a MEMS device, including etching copper to form a gap between the layer of porous dielectric material and the suspended portion of a MEMS device.

In an embodiment, forming the layer of porous dielectric material includes laminating a first dielectric film on a surface, swelling the first dielectric film, and after swelling the first dielectric film, performing a desmear etch of the first dielectric film to form a layer of porous dielectric material. In another embodiment, the gap separates the suspended copper portion from the exposed surface by a distance equal to or less than three microns. In another embodiment, the porous dielectric material comprises an organic resin. In another embodiment, the build-up carrier comprises a plurality of alternating layers of patterned conductive material and insulating material, wherein at least one of the layers of patterned conductive material is coupled to a contact point of the die.

In another implementation, an apparatus comprises a computing device including a package including a microprocessor disposed in a build-up carrier, the build-up carrier comprising a plurality of build-up layers including a first layer of porous dielectric material, and a MEMS device having a suspended copper portion anchored by the plurality of build-up layers, wherein a gap separates the suspended copper portion from an exposed surface of the first layer of porous dielectric material.

In an embodiment, the gap separates the suspended copper portion from the exposed surface by a distance equal to or less than three microns. In another embodiment, a portion of the suspended copper portion above the gap has a thickness of over 30 microns. In another embodiment, the porous dielectric material comprises an organic resin. In another embodiment, the build-up carrier comprises a plurality of alternating layers of patterned conductive material and insulating material, wherein at least one of the layers of patterned conductive material couples the MEMS device to a contact point of the micro-processor. In another embodiment, the layer of porous dielectric material has tunnels formed therein, wherein residual copper is disposed within the tunnels.

In another implementation, a semiconductor package comprises a die, a build-up carrier coupled to the die, the build-up carrier comprising a plurality of build-up layers including a first insulating layer and a second insulating layer each including a respective organic dielectric material, and a layer of silicon nitride material disposed between and adjacent to the first insulating layer and the second insulating layer. The build-up carrier further comprises a copper structure disposed between portions of the layer of second insulating layer or portions of the layer of silicon nitride material, the copper structure coupled via the plurality of build-up layers to a contact point of the die.

In an embodiment, an air gap separates the copper structure from a surface of the first insulating layer. In another embodiment, the copper structure includes a suspended portion of a MEMS device. In another embodiment, the build-up layer comprises an antenna including the copper structure. In another embodiment, a thickness of the layer of silicon nitride material is less than five hundred nanometers. In another embodiment, the build-up carrier comprises a plurality of alternating layers of patterned conductive material and insulating material, wherein at least one of the layers of patterned conductive material couples the copper structure to a contact point of the die.

In another implementation, a method comprises forming a first portion of a build-up carrier for a die, including laminating a first film comprising a first insulating layer including an organic dielectric material, and a first release layer. The method further comprises desmearing a surface of the first portion after laminating the first film, separating the first release layer after desmearing the surface of the first portion to expose a portion of the first insulating layer, disposing a first layer of titanium on the exposed portion of the first insulating layer, and forming a first copper structure on the first layer of titanium.

In an embodiment, the method further comprises disposing a film of silicon nitride material on the first copper structure, and laminating a second film on the film of silicon nitride material, the second film comprising a second insulating layer including an organic dielectric material, and a second release layer. In another embodiment, the method further comprises desmearing another surface of the first portion after laminating the second film, separating the second release layer after desmearing the other surface of the first portion to expose a portion of the second insulating layer, disposing a second layer of titanium on the exposed portion of the second insulating layer, and forming a second copper structure on the second layer of titanium. In another embodiment, the method further comprises performing an etch to expose and remove a portion of the silicon nitride material adjoining the first copper structure. In another embodiment, the etch removes a portion of the first layer of titanium to form a gap between the first copper structure and the first insulating layer.

In another implementation, an apparatus comprises a computing device including a package including a microprocessor disposed in a build-up carrier. The build-up carrier comprises a plurality of build-up layers including a first insulating layer and a second insulating layer each including a respective organic dielectric material, and a layer of silicon nitride material disposed between and adjacent to the first insulating layer and the second insulating layer. The build-up carrier further comprises a copper structure disposed between portions of the layer of second insulating layer or portions of the layer of silicon nitride material, the copper structure coupled via the plurality of build-up layers to a contact point of the die.

In an embodiment, an air gap separates the copper structure from a surface of the first insulating layer. In another embodiment, the copper structure includes a suspended portion of a MEMS device. In another embodiment, the build-up layer comprises an antenna including the copper structure. In another embodiment, a thickness of the layer of silicon nitride material is less than five hundred nanometers. In another embodiment, the build-up carrier comprises a plurality of alternating layers of patterned conductive material and insulating material, wherein at least one of the layers of patterned conductive material couples the copper structure to a contact point of the die.

Techniques and architectures for providing an integrated circuit package are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A semiconductor package comprising:
    a die;
    a build-up carrier coupled to the die, the build-up carrier comprising a plurality of build-up layers including a first layer of porous dielectric material; and
    a MEMS device having a suspended copper portion anchored by the plurality of build-up layers, wherein a gap separates the suspended copper portion from an exposed surface of the first layer of porous dielectric material, wherein the layer of porous dielectric material has tunnels formed therein, wherein residual copper is disposed within the tunnels.

2. The semiconductor package of claim 1, wherein the gap separates the suspended copper portion from the exposed surface by a distance equal to or less than three microns.

3. The semiconductor package of claim 2, wherein a portion of the suspended copper portion above the gap has a thickness of over 30 microns.

4. The semiconductor package of claim 1, wherein the porous dielectric material comprises an organic resin.

5. The semiconductor package of claim 1, wherein the build-up carrier comprises a plurality of alternating layers of patterned conductive material and insulating material, wherein at least one of the layers of patterned conductive material couples the MEMS device to a contact point of the die.

6. A method comprising:
    forming a first portion of a build-up carrier for a die, including forming a layer of porous dielectric material;
    disposing a seed layer on the layer of porous dielectric material;
    plating copper on the seed layer; and
    after plating the copper, etching copper adjacent to the layer of porous dielectric material to form a suspended portion of a MEMS device, including etching copper to form a gap between the layer of porous dielectric material and the suspended portion of a MEMS device.

7. The method of claim 6, wherein forming the layer of porous dielectric material includes:
    laminating a first dielectric film on a surface;
    swelling the first dielectric film; and
    after swelling the first dielectric film, performing a desmear etch of the first dielectric film to form a layer of porous dielectric material.

8. The method of claim 6, wherein the gap separates the suspended copper portion from the exposed surface by a distance equal to or less than three microns.

9. The method of claim 6, wherein the porous dielectric material comprises an organic resin.

10. The method of claim 6, wherein the build-up carrier comprises a plurality of alternating layers of patterned conductive material and insulating material, wherein at least one of the layers of patterned conductive material is coupled to a contact point of the die.

11. A semiconductor package comprising:
    a die;
    a build-up carrier coupled to the die, the build-up carrier comprising a plurality of build-up layers including:
        a first insulating layer and a second insulating layer each including a respective organic dielectric material; and
        a layer of silicon nitride material disposed between and adjacent to the first insulating layer and the second insulating layer; and
        a copper structure disposed between portions of the second insulating layer or portions of the layer of silicon nitride material, the copper structure coupled via the plurality of build-up layers to a contact point of the die, wherein an air gap separates the copper structure from a surface of the first insulating layer.

12. The semiconductor package of claim 11, wherein the copper structure includes a suspended portion of a MEMS device.

13. The semiconductor package of claim 11, wherein the build-up layer comprises an antenna including the copper structure.

14. The semiconductor package of claim 11, wherein a thickness of the layer of silicon nitride material is less than five hundred nanometers.

15. The semiconductor package of claim 11, wherein the build-up carrier comprises a plurality of alternating layers of patterned conductive material and insulating material, wherein at least one of the layers of patterned conductive material couples the copper structure to a contact point of the die.

16. A method comprising:
    forming a first portion of a build-up carrier for a die, including laminating a first film comprising:
        a first insulating layer including an organic dielectric material; and
        a first release layer;
    after laminating the first film, desmearing a surface of the first portion;
    after desmearing the surface of the first portion, separating the first release layer to expose a portion of the first insulating layer;
    disposing a first layer of titanium on the exposed portion of the first insulating layer;
    forming a first copper structure on the first layer of titanium;
    disposing a film of silicon nitride material on the first copper structure; and
    laminating a second film on the film of silicon nitride material, the second film comprising:
        a second insulating layer including an organic dielectric material; and
        a second release layer.

17. The method of claim 16, further comprising:
    after laminating the second film, desmearing another surface of the first portion;
    after desmearing the other surface of the first portion, separating the second release layer to expose a portion of the second insulating layer;
    disposing a second layer of titanium on the exposed portion of the second insulating layer; and
    forming a second copper structure on the second layer of titanium.

18. The method of claim 16, further comprising:
    performing an etch to expose and remove a portion of the silicon nitride material adjoining the first copper structure.

19. The method of claim 18, wherein the etch removes a portion of the first layer of titanium to form a gap between the first copper structure and the first insulating layer.

* * * * *